United States Patent [19]

Shlichta

[11] Patent Number: 4,512,846

[45] Date of Patent: Apr. 23, 1985

[54] METHOD FOR GROWTH OF CRYSTALS BY PRESSURE REDUCTION OF SUPERCRITICAL OR SUBCRITICAL SOLUTION

[75] Inventor: Paul J. Shlichta, San Pedro, Calif.

[73] Assignee: The United States of America as represented by the Administrator of the National Aeronautics and Space Administration, Washington, D.C.

[21] Appl. No.: 342,944

[22] Filed: Jan. 26, 1982

[51] Int. Cl.³ .............................................. C30B 7/10
[52] U.S. Cl. .............................. 156/623 Q; 23/295 R
[58] Field of Search .................... 423/339, DIG. 11; 156/621, 623 R, 623 Q, DIG. 89; 23/295 R

[56] References Cited

FOREIGN PATENT DOCUMENTS 28272 3/1979 Japan ................................ 23/295 R

OTHER PUBLICATIONS

Phase Diagrams, vol. 3, 1970, Academic Press, Nielsen et al., pp. 36, 37, 40.
P. J. Shlichta and R. E. Knox, J. Crystal Growth, 3, 4 (1968), 808–813.
H. S. Booth and R. M. Bidwell, Chem. Rev., 44 (1949), 447–513.
V. J. Krukonis et al., "Supercritical Fluid Extraction of Plant Materials Containing Chemotherapeutic Drugs," manuscript paper presented at AIChE 87th National Meeting, Boston, MA, 1979.
R. J. Janssen-van Rosmalen and P. Bennema, J. Crystal Growth, 42 (1977), 224–227.
P. S. Chen, P. J. Shlichta, W. R. Wilcox and R. A. Lefever, J. Crystal Growth, 47 (1979), 43–60.
Abstract of Thesis, P. S. Chen, Ph.D., Chem. Eng. Dept., Univ. of Southern California (1977).
P. J. Shlichta, "Crystal Growth in a Spaceflight Environment," MPS Experiment #770100, Third Semi-Annual Report (Oct. 1979–Mar. 1980), Jet Propulsion Laboratory.
P. J. Shlichta, "Minimization of Convection during Crystal Growth from Solution," paper presented at the AACG Meeting, San Diego, CA, 7/25/81.
J. F. Kramer and W. A. Tiller, J. Chem. Phys., 37 (1962), 841.
R. F. Sekerta, ibid, 46 (1967), 2341–2351.
E. D. Kolb, J. C. Grenier and R. A. Laudise, "Solubility and Growth of AlPO$_4$ in a Hydrothermal Solvent:HCl," J. Crystal Growth, 51 (1981), 178–182.

Primary Examiner—Hiram H. Bernstein
Attorney, Agent, or Firm—Paul F. McCaul; John R. Manning; Thomas H. Jones

[57] ABSTRACT

Crystals (51) of high morphological quality are grown by dissolution of a substance (28) to be grown into the crystal (51) in a suitable solvent (30) under high pressure, and by subsequent slow, time-controlled reduction of the pressure of the resulting solution (36). During the reduction of the pressure interchange of heat between the solution (36) and the environment is minimized by performing the pressure reduction either under isothermal or adiabatic conditions.

15 Claims, 10 Drawing Figures

METHOD FOR GROWTH OF CRYSTALS BY PRESSURE REDUCTION OF SUPERCRITICAL OR SUBCRITICAL SOLUTION

BACKGROUND OF THE INVENTION

1. Origin of the Invention

The invention described herein was made in the performance of work under a NASA Contract and is subject to the provisions of Section 305 of the National Aeronautics and Space Act of 1958, Public Law 85-568 (72 STAT 435; 43 USC 2457).

2. Field of the Invention

The present invention is directed to a method and apparatus for growing high quality crystals, and particularly to a method and apparatus for growing high quality crystals by programmed pressure reduction of a supercritical or subcritical solution.

3. Brief Description of the Prior Art

Crystals of solid substances are conventionally grown either from a liquid or vapor phase of the substance, or from a solution of the substance in a second substance. The second substance, the solvent, usually is a liquid at ambient temperature. All methods of crystal growth from a solution involve shifting of the solid versus solute-solvent equilibrium at least in the vicinity of the crystal-solution interface so that the solution becomes supersaturated with the substance to be crystallized.

By far, the most common method of shifting the equilibrium is gradually changing the temperature of the entire crystal solution system. Furthermore, because the solubility of most substances in various solvents usually increases with increasing temperature, the majority of crystallization processes of the prior art involve gradual cooling of the crystal-solution system. The method of thermally shifting the equilibrium between dissolved solid and solution to promote crystallization is hereinafter briefly referred to as "temperature driven crystallization." As is appreciated by those skilled in the art, temperature driven crystallization requires the transfer, usually withdrawal, of large amounts of heat from the solution.

A majority of the temperature driven crystallization processes are performed at ambient or near ambient pressure. Nevertheless, in some instances, such as for example in the industrial process for growing quartz ($SiO_2$) crystals, the temperature driven crystallization process is performed at a high pressure because the solubility of $SiO_2$ in the solvent is increased at high pressure.

Although the prior art temperature driven crystallization techniques are widely used even when relatively large and morphologically perfect or near perfect crystals are desired, they suffer from several disadvantages. One disadvantage is that precise timecontrolled temperature regulation of a solution containing a growing crystal is very difficult because temperature adjustments of the environment have a relatively long lagtime before they take effect in the solution-crystal system.

Another disadvantage of the temperature driven crystal growing technique is that crystal growth by the temperature driven technique in the earth's gravitational field is invariably accompanied by convection currents. The convection currents cause morphological irregularities and fluid inclusions in the crystals. Although several methods have been suggested for minimizing the adverse effect of the convection currents on the quality of the resulting crystals, the prior art is still far from achieving a fully satisfactory solution to this problem.

The above-noted disadvantages of the temperature driven crystal growing techniques are buttressed by relatively recent advances in solid state physics, semiconductor and related technology which have continuously increased the quantitative and qualitative requirements for large, morphologically near perfect crystals of various substances. For example, quartz ($SiO_2$) crystals are presently in highest demand for industrial and scientific purposes. Other inorganic crystals of high quality, such as zinc oxide (ZnO), aluminum phosphate ($AlPO_4$), beryl and tourmalene are also in high demand.

In order to overcome the adverse effect of convection currents in the thermal growth of large crystals, growing of crystals in a zero gravity, i.e., spaceflight, environment was also suggested. Obviously, due to its tremendous expense, this solution offers the hope of only a very limited immediate industrial application.

Another method for reducing convection currents in temperature driven crystal growing processes in the earth's gravitational field was suggested at a presentation by P. J. Shlichta to an American Association for Crystal Growth Meeting in San Diego, Calif. on July 25, 1981, and also in a report titled Crystal Growth in Spaceflight Environment, Jet Propulsion Laboratory, California Institute of Technology. This method however is practically limited to crystal configurations of only a few millimeter thickness. This size limitation for the purpose of reducing convection currents, is inherent in any temperature driven crystallization process.

Another technique for shifting the solid versus solute-solvent equilibrium in a solution and more specifically growing of large, high morphological quality crystals has been described in an article by P. J. Shlichta and R. E. Knox in the Journal of Crystal Growth 3, 4 (1968), pp. 808–813, North Holland Publishing Co., Amsterdam. In accordance with this technique, localized supersaturation of an on-the-average saturated solution, and thereby crystal formation are achieved in certain parts of a solution when the solution is subjected to a centrifugal force field of $10^4$–$10^6$ g magnitude.

Other prior art methods of general interest to the present invention, which achieve supersaturation of a solution for the purpose of promoting crystal growth, involve gradual removal of the solvent by evaporation, and interdiffusing two solutions having respective solutes which chemically react with one another to form a substance to be crystallized.

The relatively recent scientific and industrial requirements for morphologically perfect or near perfect crystals of certain substances, such as quartz, have also prompted increased scientific efforts to develop techniques for studying the mechanism of crystallization, and more particularly, the interface of a crystal with a slightly super- or slightly under-saturated solution. Several authors suggested a "thermal wave technique" or experiment for this purpose. Briefly, in a thermal wave experiment, a crystal is located in substantially one end of an elongated container and the crystal is in contact with a solution of the substance comprising the crystal. The entire system is kept, on the average, at a predetermined temperature. Under conditions of equilibrium, the solution is, of course, saturated with the substance comprising the crystal. In order to cause the crystal-liquid interface to periodically grow and decrease macroscopically, temperature of the remote, liquid-containing end of the container is periodically oscillated between temperature values which respectively exceed and fall below the predetermined temperature. Each change in the temperature of the remote end of the container, travels across the solution in the container in the form of a "thermal wave" and correspondingly affects the crystal-liquid interface. The interface may be observed visually and by appropriate instrumental techniques.

An important purpose of the thermal wave experiments, other than scientific study, is to establish optimal conditions and parameters for growing of large, high morphological quality crystals for industrial purposes. However, as is explained below, because of its many disadvantages, the above-noted purpose is not realized well by the thermal wave technique.

More specifically, a substantial time-lag is involved in the travel of the thermal wave through the solution, and, therefore, convection currents arise inevitably in the solution. Therefore, the exact conditions at the crystal-liquid interface are not well known; they must be either measured, or inferred from calculations. Measurements of the conditions of the crystal-liquid interface, however, may be accomplished only with dubious precision. Calculations of the conditions on the other hand, require complex mathematical treatment and many assumptions, so that the calculated conditions are of dubious validity. The difficulty in obtaining and analyzing data relating to crystal growth by the thermal wave technique becomes readily apparent for example, by study of the article "Mathematical Analysis of the Thermal Wave Technique for Square-Law Kinetics," by R. F. Sekerka in *The Journal of Chemical Physics*, Volume 46, pp. 2341-2351 (1966).

Dependence of solubility of a solid substance in a liquid solvent as a function of pressure of the system was recognized a long time ago. Thus, it was known in the prior art that whenever dissolution of a solid in a liquid decreases the overall volume of the entire solid-liquid system, an increase in the pressure of the system causes an increase in the solubility of the solid. In other words, the Le Chatelier Braun principle is applicable to the influence of pressure to the solubility of a solid substance in a liquid.

Furthermore, it was recognized at least theoretically, in the prior art that supercritical fluids are capable of dissolving solid substances to a significant extent. An article written by H. S. Booths and R. M. Bidwell in *Chemical Reviews*, Volume 44, (1949) pp. 477-513 titled "Solubility Measurement in the Critical Region" contains a review of prior art experiments regarding solubility of solids in fluids near or above the critical temperature of the fluids, and at high pressures. The above-noted article shows, for example, that quartz ($SiO_2$) is approximately five times more soluble in steam at 650° F. at approximately 425 PSI than at 150 PSI. In a manuscript of a paper by V. J. Krukonis, A. R. Branfman, M. G. Broome, and A. T. Sneden titled "Supercritical Fluid Extraction of Plant Materials Containing Chemotherapeutic Drugs", the authors describe selective extraction of certain organic substances by solvents in supercritical condition. The solvents disclosed were carbon dioxide ($CO_2$), and ethylene ($CH_2=CH_2$). The paper which was orally presented at the 87th National Meeting of the American Institute of Chemical Engineers in 1979 in Boston, Mass. includes a graph showing the pressure dependent solubilities of p-iodochlorobenzene in ethylene at 25° C., and of naphtalene in carbon dioxide at 45° C.

The above-noted paper by V. J. Krukonis et al. also discloses an apparatus wherein the extraction of naphtalene, or plant material with supercritical carbon dioxide was performed. Briefly, the apparatus includes a pressure vessel adapted for containing the solute (naphtalene) and the solvent carbon dioxide at 50° C. and 300 atmosphere pressure, and a second pressure vessel wherein the carbon dioxide containing dissolved solids is expanded to about 100 atm. causing precipitation of the solids.

The above-noted article by H. S. Booth and R. M. Bidwell in *Chemical Reviews* contains a suggestion to the effect that information gleaned from studying the behavior of solute-solvent systems near the critical region may become useful as a basis for growing large crystals of various substances for optical and other scientific purposes. The context of this article indicates, however, that the suggestion relates to the possibility of taking advantage of increased solubilities of a solute at high pressures in a temperature driven crystallization process.

The present applicant is unaware of prior art experimental or practical investigations or results wherein the strong pressure dependence of certain solids in fluids is utilized under isothermal or adiabatic conditions for slow growing of relatively large, high morphological quality crystals. The present applicant is also unaware of prior art wherein the pressure dependence of the solubility of a solid in a suitable fluid is utilized for studying the crystal-solvent interface.

SUMAMRY OF THE INVENTION

It is an object of the present invention to provide a process and apparatus for growing relatively large, high morphological quality crystals of a desired substance from a solution of the substance.

It is another object of the present invention to provide a process and apparatus for experimentally studying a changing crystal-solution interface in a crystal-solution-system wherein conditions of the system are precisely and instantaneously controllable.

These and other objects and advantages are attained by dissolving a substance to be crystallized in a suitable fluid solvent under high pressure, and by subsequently, slowly, and gradually decreasing the pressure while maintaining minimal heat flow conditions so as to cause crystallization of the substance. The minimal heat flow conditions are attained when the solution and the crystallizing solid is kept under isothermal or adiabatic conditions. In a technique for studying a crystal-solution interface principally for the purpose of optimizing parameters of crystal growth in industrial processes, controlled conditions at a changing crystal-solution interface are obtained by precisely controlled, programmed oscillation of the pressure of a crystal solution system at a substantially constant temperature.

The features of the present invention can be best understood together with further objects and advantages by reference to the following description, taken in connection with the accompanying drawings wherein like numerals designate like parts.

DESCRIPTION OF THE PREFERRED EMBODIMENT

The following specification taken in conjunction with the drawings sets forth the preferred embodiment of the present invention in such a manner that any person skilled in the arts of growing crystals and of building pressure vessels can use the invention. The embodiments of the invention disclosed herein are the best modes contemplated by the inventor for carrying out his invention, although it should be understood that various modifications can be accomplished within the parameters of the present invention.

Figure 1:
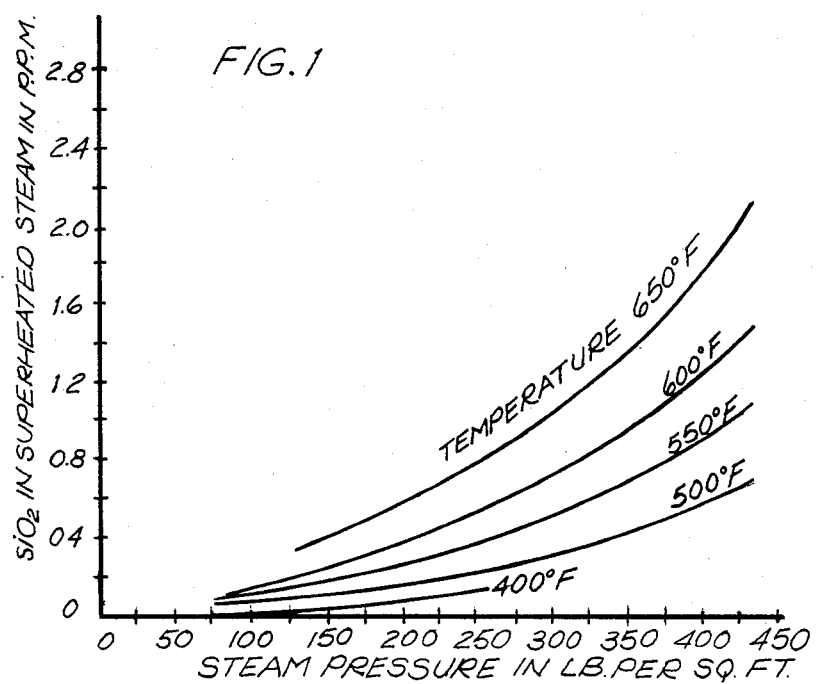
FIG. 1 is a graph showing the increase of solubility of quartz ($SiO_2$) in steam at various temperatures as a function of pressure.
Figure 2:
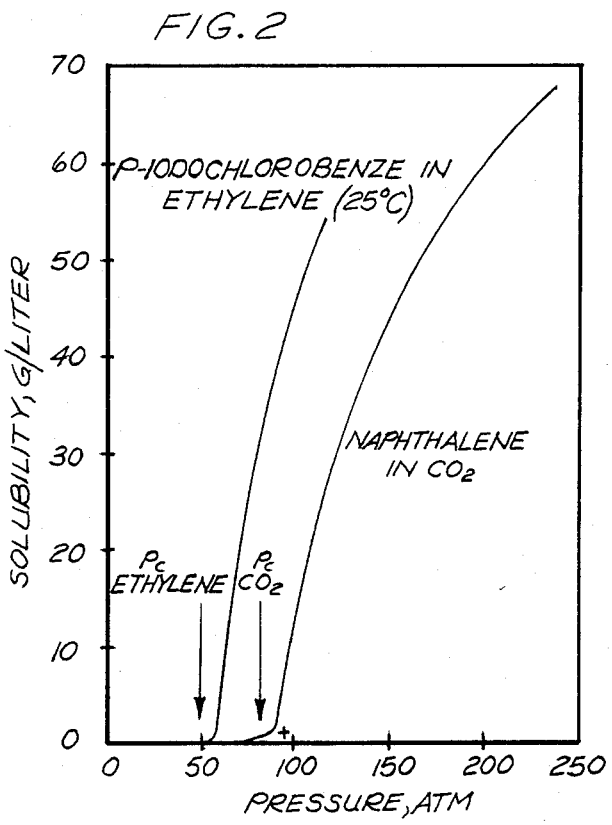
FIG. 2 is a graph showing the increase of solubility of p-iodochlorobenzene in ethylene and of naphtalene in carbondioxide ($CO_2$) as a function of pressure.

Referring now to the drawing Figures, and particularly to the graphs of FIGS. 1 and 2, the theoretical basis for the novel process and apparatus of the present invention, is disclosed. As it is stated in the introductory section of the present application for patent, the solubility of substances in a liquid solvent depends on the pressure of the system as well as on its temperature. In accordance with the well-known Le Chatelier Braun principle, an increase in the pressure of a fluid-solvent solid-solute system at a constant temperature causes dissolution of solid provided the total volume of the systems is decreased by the dissolution of the solid.

Furthermore, the prior art established that many inorganic and organic substances have very significant solubilities in supercritical fluids. As is wellknown by those skilled in physics or chemistry, the critical temperature of a fluid is that temperature above which the fluid cannot be compressed to yield a two phase liquid and gas system, no matter how large a pressure is used for the compression. In other words, the fluid can only exist in one phase above the critical temperature. In the ensuing description, the respective states of a fluid solvent are referred to as subcritical, or supercritical, as applicable, and the term subcritical fluid should be understood to mean the liquid phase of a subcritical fluid.

Thus, in accordance with the present invention it was discovered that pure, very good morphological quality, and relatively large crystals of various solid substances may be grown by dissolving the solid substance in a subcritical or supercritical fluid at a high pressure, and subsequently, slowly, and gradually decreasing the pressure while minimizing flow of heat between the solid-solution system and its environment. Conditions wherein heat flow between the solid-solution system and its environment is minimized are attained when the system is kept under isothermal or adiabatic conditions during decrease of the pressure.

The process of the present invention is applicable to those solid-solute fluid-solvent systems wherein increase of pressure results in increasing solubility of the solid in the fluid solvent. Generally speaking, the above requirement is met by the predominant majority of solid-fluid systems. Particularly, all open frame-work crystalline substances, as well as many other crystalline substances, in combination with most inorganic solvents, such as $H_2O$, $NH_3$, $CO_2$, $H_2S$ and most organic solvents, meet the above-noted requirement. Very importantly from a utilitarian viewpoint, the $SiO_2$-water system, as well as most silicates and ceramic materials in water, meet the above-noted requirement.

With regard to the pressures required for performing the process of the present invention, it is noted that the solubility versus pressure curve of most systems of interest, such as for example of the $SiO_2$-water system, increases significantly in pressure ranges exceeding 10 atmosphere. An upper limit of the pressures which may be used in accordance with the present invention appears to be defined by the engineering limitations of an apparatus wherein the process is performed, rather than by the process itself.

The pressure dependence of the solubility of solid substances in fluids usually increases rapidly with increasing temperature, and usually becomes very significant at temperatures approximately equalling or exceeding the critical temperature of the solid-fluid system. Therefore, the process of the present invention is preferably practiced with supercritical fluids, or with fluids having a temperature equalling or being only slightly below the critical temperature.

It is an important feature of the novel process of the present invention, however, that during a crystallization step while the pressure of the supercritical or subcritical solution is gradually decreased to promote crystal growth, the entire system is kept under conditions wherein interchange of heat between the system and its surrounding is kept at a minimum. These conditions are practically attained by performing the crystallization step under isothermal conditions, wherein the entire system is kept at as constant temperature as possible. Alternatively, minimal heat flow conditions may also be attained when the system is kept under adiabatic conditions, i.e., as well insulated from its environment as is practically possible.

While at first glance, isothermal and adiabetic conditions for crystal growth may appear to represent two opposite extremes, it is worthy of consideration in this regard, that under conditions of the prior art "temperature driven crystllization techniques," a substantial amount of heat is deliberately withdrawn from the crystallizing system. In contrast, with the prior art and in accordance with the present invention, under isothermal conditions the temperature of the crystallizing system is kept constant. Therefore, only a small amount of heat is added or withdrawn (usually withdrawn) from the system to compensate for the heat of crystallization, and for possible change of heat content of the fluid solvent as it expands. As is well-known by those skilled in physics and chemistry, the heat of crystallization is usually small. Furthermore, expansion of a fluid against no resistance results only in a small change of the heat content of the fluid, in case of an ideal gas such change is theoretically zero. It is readily apparent from the above, that the amount of heat withdrawn or added to the system under the above-noted isothermal conditions is very small compared to the amount of heat withdrawn from the system in accordance with the prior art, where the solution containing the crystals to be grown is deliberately cooled to promote crystal growth.

The above-noted considerations are also applicable when the pressure reduction step in the crystallization of the present invention is performed under adiabatic conditions. Under these conditions, any temperature change in the solid-solution system is due to the heat of crystallization, and to changes in the heat content of the expanding fluid. Since the above-noted changes are small, the temperature changes are small, and the adiabatic conditions actually approximate the isothermal conditions. Both are in contrast, however, with the prior art, where the solid-solution system is deliberatiely cooled, and the principal driving force for crystallization is a decrease in temperature. In accordance with the present invention, the principal driving force for crystallization is a change in the pressure of the system.

Referring now to the schematic views of FIGS. 3–6, an apparatus 20 particularly adapted for performing the process of the present invention, is disclosed. Because crystalline, pure $SiO_2$ (quartz) of high morphological quality is in high demand for industrial and scientific purposes, the apparatus 20 is described as the present invention. It should be understood, however, that neither the apparatus nor the process of the present invention is limited to the growing of quartz crystals. For example, zinc oxide (ZnO), aluminum phosphate ($AlPO_4$) beryl, tourmalane and other crystals of industrial or scientific importance may also be advantageously grown in accordance with the present invention.

As is shown in FIGS. 3–6, the apparatus 20 includes a first pressurizable vessel 22 comprising a cylinder 24 and a piston 26 movably mounted in the cylinder 24. The solid material 28, such as $Si)_2$ to be grown into crystals, is placed into the first pressure vessel 22 and a solvent 30, such as an alkaline aqueous solution, is added to the first pressure vessel 22 through a suitable addition valve 32. Thereafter, pressure is applied to the first pressure vessel 22 through the movable piston 26. The applied, substantially constant pressure ($P_1$) is maintained for a prolonged period of time to affect full or partial dissolution of the solid 28 which is contained in the first pressure vessel 22.

Although it is not shown on the schematic view of FIG. 1, the temperature of the fluid and solid contents of the first pressure vessel 22 is kept substantially constant during the above-noted dissolution step. This may be accomplished by using state-of-the-art technology, such as a temperature probe (not shown) mounted in the interior 34 of the first pressure vessel 22, and heating coils or elements (not shown) incorporated or mounted around the first pressure vessel 22.

Figure 3:
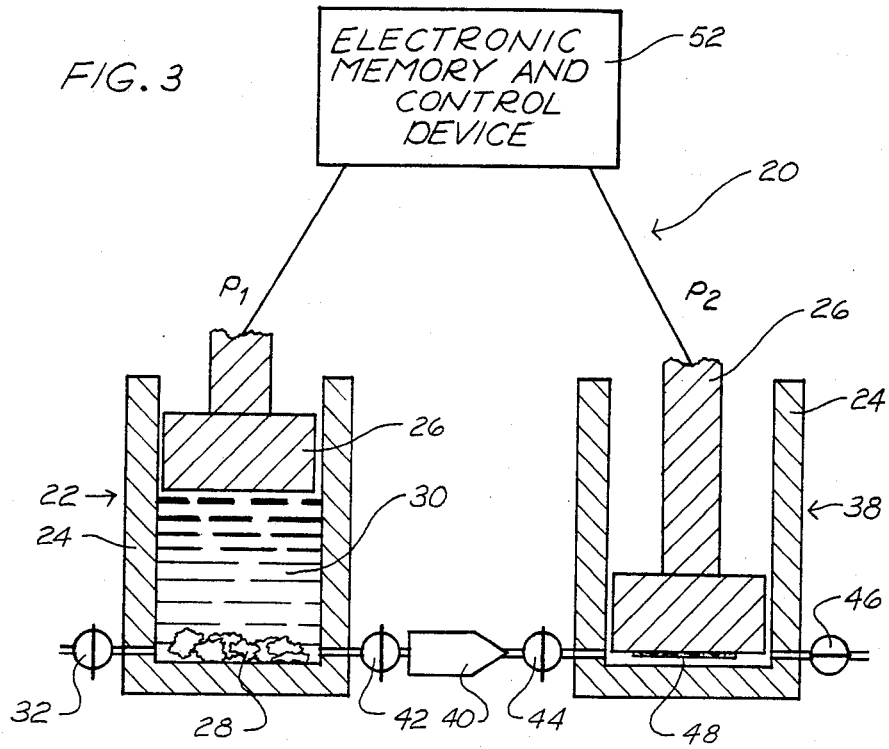
FIG. 3 is a schematic view showing a preferred embodiment of the apparatus of the present invention, performing a step in the process of the present invention wherein a solid substance is dissolved in a fluid solvent under high pressure $P_1$ in a first pressure vessel.
Figure 4:
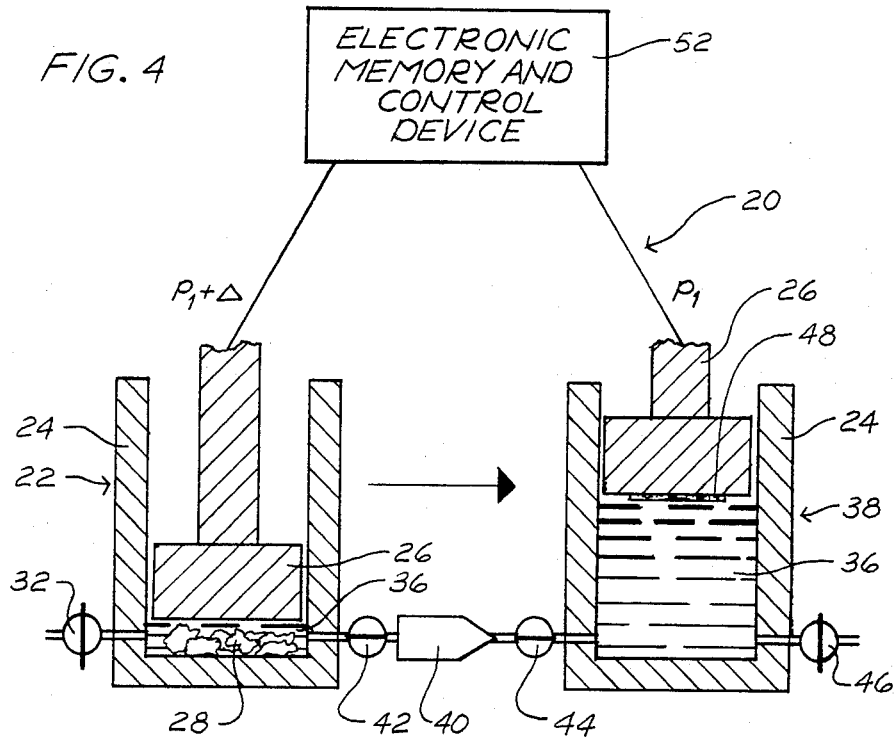
FIG. 4 is a schematic view showing the apparatus of FIG. 3, performing a step in the process wherein a fluid solution saturated with the solid substance at pressure $P_1$ is tranferred through a suitable filter system into a second pressure vessel.

For dissolution of $SiO_2$, the constant temperature of the interior 34 of the vessel 22 may equal or even exceed 300° C. The substantially constant pressure ($P_1$) in the first vessel 22 may be as high as 200 atm. For comparison it is noted, that in accordance with prior art techniques, quartz crystals are grown under "temperature driven crystallization" conditions which involve a temperature gradient in a pressurized vessel and temperatures and pressures comparable to the above-noted temperature and pressure parameters utilized in the process of the present invention. Furthermore, when the process of the present invention is used for growing quartz crystals, the aqueous solvent is rendered alkaline by addition of sodium hydroxide, sodium carbonate or a like mineralizing agent. This is also done in the prior art to increase the solubility of $SiO_2$ in the aqueous solvent. FIG. 3 shows the apparatus 20 of the present invention performing the step of dissolution, as described above.

In alternative embodiments of the process of the present invention, the solvent may be ammonia, hydrogen sulphide, sulphur dioxide, or other unorganic or organic solvents.

After the dissolution step has been performed for a sufficiently long period of time to substantially saturate the solution in the first pressure vessel 22, the saturated solution 36 is transferred into a second pressure vessel 38. The step of transferring the saturated solution 36 into the second pressure vessel 38 through a suitable filter system 40 is shown on FIG. 4.

Valves 42 and 44 are connected to the respective first and second presure vessels 22 and 38 to permit the transfer of the saturated solution 36 through the filter system 40 at a pressure which is only slightly higher than $P_1$. This pressure is indicated on FIG. 4 as $P_1 + \Delta$.

During the transfer of the saturated solution 36 from the first pressure vessel 22 into the second pressure vessel 38, the temperature of the solution 36 is kept as constant as practically possible, and the pressure in the second vessel 38 is kept at $P_1$.

The second pressure vessel 38 is substantially identical in construction to the first pressure vessel 22. Thus, it also includes a cylinder 24, and a movably mounted piston 26 which is capable of regulating pressure in the cylinder 24. In addition to the valve 44, an additional valve 46 is attached to the second pressure vessel 38. The additional valve 46 is adapted for draining fluid from the second pressure vessel 38.

A suitable seed crystal 48 is mounted to the piston 26 to prompt and promote crystal growth in the second pressure vessel 38. The seed crystal 48 for the growing of quartz is preferably a flat plate shaped crystal as is shown in the drawing Figures.

Figure 5:
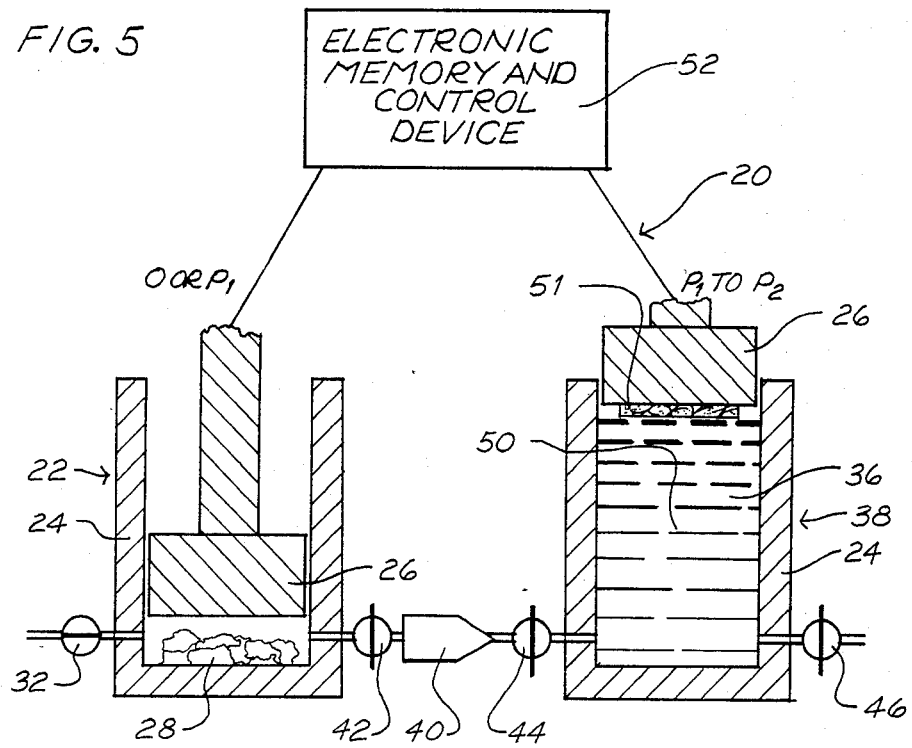
FIG. 5 is a schematic view showing the apparatus of FIG. 3, performing a step in the process wherein pressure in the second pressure vessel is slowly and gradually decreased from $P_1$ to $P_2$ and the solid substance crystallizes from the fluid solution.
Figure 6:
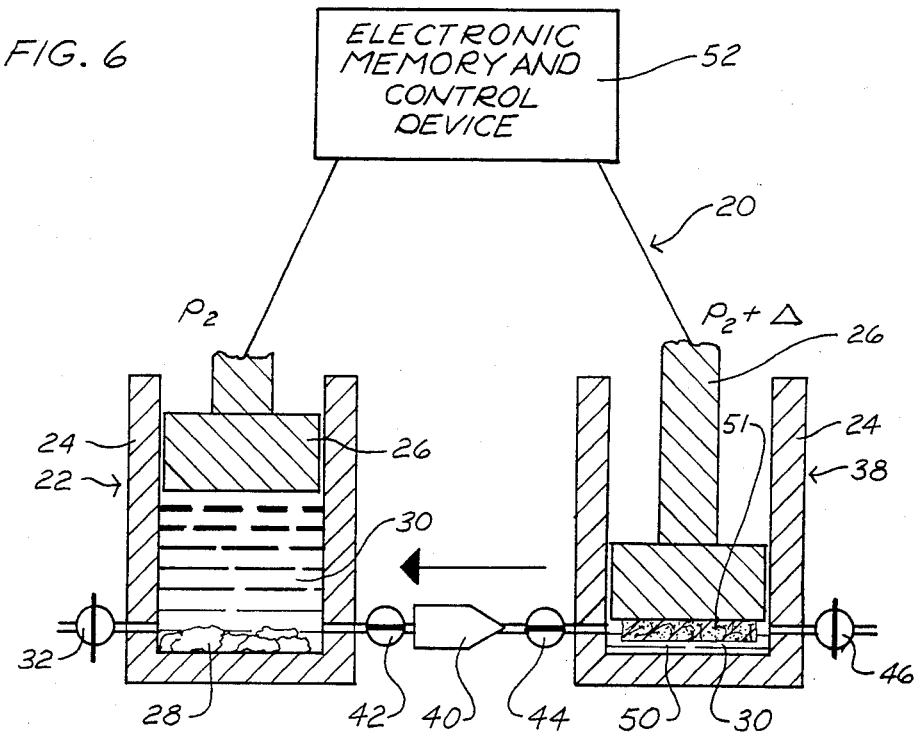
FIG. 6 is a schematic view showing the apparatus of FIG. 3, performing a step in the process wherein fluid solution is retransferred from the second pressure vessel into the first pressure vessel to dissolve newly added solid substance at pressure $P_1$.
Figure 7:
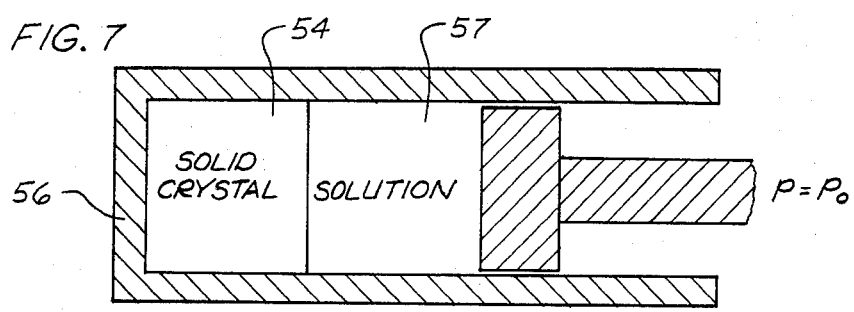
FIG. 7 is a schematic view showing a step in a "pressure wave-type" crystal-liquid interface observation experiment in accordance with the present invention.
Figure 8:
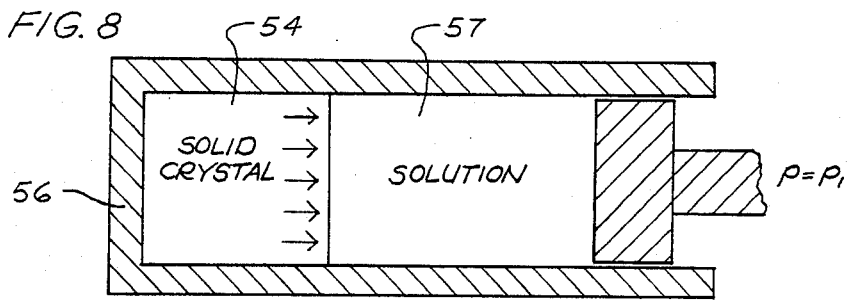
FIG. 8 is a schematic view showing another step in the pressure wave-type crystal-liquid interface observation experiment.
Figure 9:
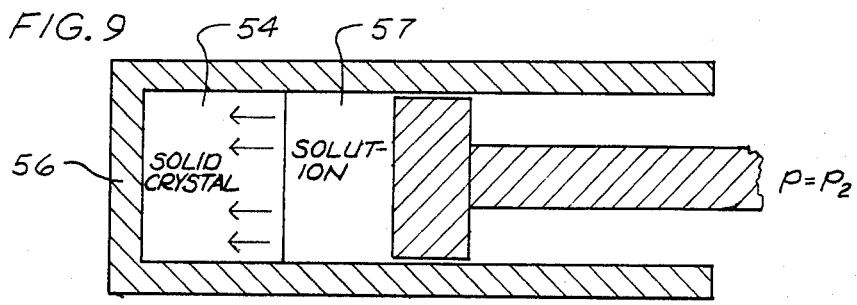
FIG. 9 is a schematic view showing still another step in the pressure wave-type crystal-liquid interface observation experiment.

FIG. 5 discloses the step of crystallization in the process of the present invention. During crystallization, pressure in the second pressure vessel 38 is gradually and slowly decreased from $P_1$ to a substantially lower value, $P_2$. For example, during the crystallization of quartz, the pressure may be decreased from approximately 50 atm to approximately 10 atm. The temperature of the solution 50 within the second pressure vessel 38 is kept as constant as possible during the crystallization step.

Alternatively, as was discussed above, the second pressure level 38 may be well heat insulated so that the crystallization is adiabatic. As it was further discussed above, under adiabatic conditions, the temperature of the solution 36 and of the crystals therein undergoes only an insignificant change compared to the change in pressure. The crystallization step may be performed for several weeks or months in order to obtain very high quality crystals. As is shown on FIG. 5, the crystal 51 grows principally on, and around the seed crystal 48.

Because the seed crystal 48 is mounted to the piston 26, crystal growth in the second pressure vessel 38 is substantially in a downward direction. As the prior art already realized this, crystal growth in a downward direction is already conducive to the formation of high quality crystals because downward growth is likely to minimize convection currents. In the herein described system, heat flow within the system is minimal and thermal convections in the solvent are virtually nonexistent. If minimization of convection becomes less important for some reason, the seed crystal 48 may be located elsewhere in the cylinder 24 of the second pressure vessel 38.

While the step of crystallization is performed in the second pressure vessel 38, the first pressure vessel may be idle, or may be replenished with solid material 28. The first pressure vessel 22 may also be utilized for dissolution of more solid material 28 while crystallization is performed in the second pressure vessel 38.

After the step of crystallization is completed in the second pressure vessel 38, the liquid contents 50 of the same may be retransferred to the first pressure vessel 22 to act therein as the solvent 30 in a subvessel sequent dissolution step. The step of retranferring the solvent 30 is schematically shown on FIG. 6. Thereafter, the grown crystal or crystals 51 are removed from the second pressure vessel 38. Alternatively, the grown crystals 51 may be left in the second pressure vessel 38 to receive further growth from a freshly saturated solution 36 in a subsequent crystallization step.

The above described apparatus performs the steps of dissolution and pressure reduction driven crystallization in a step-wise manner. However, an apparatus may also be devised which performs the process of the present invention in a continuous rather than step-wise cycle.

As it was stated above, the process of the present invention is preferably practiced with supercritical fluids, and the steps of dissolution and crystallization may require considerably long time periods. As is schematically shown on FIGS. 3–6, the pressures in the pressure vessels 22 and 38 are regulated automatically in the predetermined, desired manner by an electronic memory and control device 52. The electronic memory and control device 52 is constructed in accordance with the state of the electronic arts. It may also advantageously regulate the valves 32, 42, 44 and 46, so that during the prolonged dissolution and crystallization steps, operation of the apparatus 20 is automatic.

Referring now to FIGS. 7–10, utilization of the process of the present invention for the purpose of observing and studying a growing or dissolving crystal-solution interface, is disclosed. As it was described in the introductory section of the present application for patent, scientific study of such a crystal-solution interface is undertaken in the prior art in a "thermal wave" experiment or technique. The thermal wave technique, however, suffers from many disadvantages. The disadvantages are principally caused by the fact that propagation of a heat wave is not instantaneous in an elongated tube.

In accordance with the present invention, a solid-crystalline substance 54 is contained in an elongated pressure vessel 56 in contact with a saturated solution 57 of the substance 54 at a predetermined time average pressure $P_0$. In other words, the pressure is kept at $P_0$ for sufficiently long time to cause a suitable solvent in contact with the crystalline substance 54 to become saturated with regard to the substance 54. Interchange of heat of the system with its environment is minimized, which, as it was discussed above, may be accomplished by insulating the pressure tube 56 or keeping the temperature of the entire contents of the pressure tube 56 as constant as practically possible throughout the entire experiment.

Figure 10:
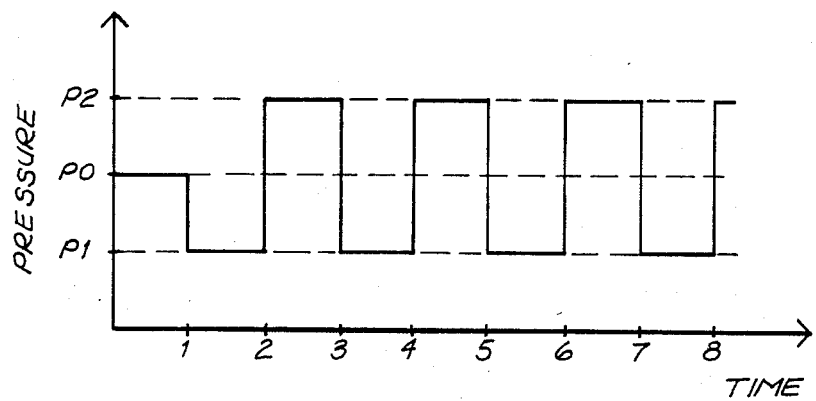
FIG. 10 is a graph showing the variance of pressure of a fluid solution as a function of time in the pressure wave-type crystal-liquid interface observation experiment of the present invention.

After equilibrium is reached with regard to the saturation of the solvent with the crystalline substance 54, the pressure in the pressure vessel 56 is periodically changed in the manner shown on the graph of FIG. 10, so that the time average pressure remains substantially at $P_0$.

In accordance with the above-stated principles, increasing the pressure causes dissolution of more crystalline substance 54, and therefore a dissolving crystal-liquid interface. Conversely, decreasing the pressure causes a growing crystal-fluid interface. The interface is observed by visual and instrumental techniques as in the prior art. The principal advantages of the presently described "pressure wave technique" are that propagation of pressure in the system is uniform and instantaneous, and thermal convections are eliminated or very significantly minimized in the system. Consequently, the conditions of the experiment are much better controlled than in the analogous "thermal wave" experiment and the pressure wave technique is well adapted for optimizing the parameters or industrial crystal growing processes.

What has been principally described above is a novel process and apparatus for growing relatively large, high morphological quality crystals in supercritical or near critical fluid solvents by programmed reduction of the pressure of the fluid solvent. Several modifications of the above-described process and apparatus may become readily apparent to those skilled in the art in light of the above disclosure. Consequently, the scope of the present invention should be interpreted solely from the following claims.

What is claimed is:

1. A process for growing a crystal, comprising:
    dissolving at least a portion of a substance to be grown into a crystal in a suitable fluid solvent at a high pressure to yield a solution and at or near the critical temperature, and
    gradually decreasing the pressure of the solution while minimizing heat flow between the solution and its environment to produce a substantial increase in volume.

2. The process of claim 1 wherein the step of dissolving is performed at a temperature which equals or exceeds the critical temperature of the system.

3. The process of claim 1 wherein the high pressure exceeds 100 atmosphere.

4. The process of claim 1 wherein the substance is silica, and the solvent is water.

5. The process of claim 4 wherein the water additionally contains a mineralizing agent.

6. The process of claim 1 wherein the solvent is selected from a group consisting of ammonia, sulfur dioxide, and hydrogen sulfide.

7. The process of claim 1 wherein a suitable externally provided seed crystal is contained in the solution while the pressure of the solution is gradually 8. The process of claim 1 wherein the step of dually decreasing the pressure of the solution is performed at under substantially isothermal conditions.

9. The process of claim 1 wherein the step of gradually decreasing the pressure of the solution is performed under substantially adiabatic conditions.

10. A process for growing a crystal of high morphological quality, comprising the steps of:
compressing to a high pressure a system containing a suitable fluid solvent and a solid substance from which the high quality crystal is to be grown;
maintaining the high pressure in the system and at or near the critical temperature to affect dissolution of at least a significant portion of the solid substance to yield a solution;
removing undissolved solid substance from the solution while maintaining the high pressure of the solution, and
gradually decompressing the system to gradually decrease the pressure of the solution while minimizing interchange of heat of the system with its environment to provide a substantial increase in volume whereby a high quality crystal of the substance is grown in the system.

11. The process of claim 10 wherein at least during the maintaining, removing, and decompressing steps the system is kept at a substantially constant temperature, and the substantially constant temperature is in the range of the critical temperature of the 12. The process of claim 11 wherein the substantially constant temperature equals or exceeds the critical temperature of the solvent.

13. The process of claim 10 wherein a suitable externally provided seed crystal is present in the solution while the system is gradually decompressed.

14. The process of claim 10 wherein the solid substance is $SiO_2$ and the solvent is water.

15. The process of claim 14. wherein the water contains a mineralizing agent.

* * * * *